(12) United States Patent
Aoki et al.

(10) Patent No.: US 6,275,408 B1
(45) Date of Patent: Aug. 14, 2001

(54) FERROELECTRIC MEMORY AND METHOD

(75) Inventors: Katsuhiro Aoki, Ibaraki (JP); Tomoyuki Sakoda, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/605,933

(22) Filed: Jun. 28, 2000

Related U.S. Application Data (60) Provisional application No. 60/141,926, filed on Jun. 30, 1999.

(51) Int. Cl.[7] .................................................... G11C 11/22
(52) U.S. Cl. ............................................. 365/145; 365/149
(58) Field of Search ...................................... 365/145, 149

(56) References Cited

U.S. PATENT DOCUMENTS 5,400,275  *  3/1995  Abe et al. .............................. 365/145

* cited by examiner

*Primary Examiner*—David Nelms
*Assistant Examiner*—M. Tran
(74) *Attorney, Agent, or Firm*—Carlton H. Hoel; W. James Brady; Frederick J. Telecky, Jr.

(57) ABSTRACT

Ferroelectric memory with one-capacitor/one-transistor cells and a reference cell with double the capacitance plus a sense amplifier for comparing transient currents in resistors at the sense amplifier inputs. The reference cell includes a diode to prevent reference capacitor polarization switching.

7 Claims, 8 Drawing Sheets

FIG. 7a  MAIN CAPACITOR POLARITY: ⇩ (DATA: 0)

FIG. 7b  MAIN CAPACITOR POLARITY: ⇧ (DATA: 1)

FERROELECTRIC MEMORY AND METHOD

RELATED APPLICATIONS

This application claims priority from US provisional patent application Ser. No. 60/141,926, filed Jun. 30,1999. The following pending U.S. patent applications disclose related subject matter: Ser. Nos. 09/392,988 filed Sep. 9,1999 These applications have a common assignee with the present application.

BACKGROUND OF THE INVENTION

The invention relates to electronic devices, and, more particularly, to ferroelectric memories and methods.

In current semiconductor DRAM memory, the typical memory cell consists of a capacitor for electrical charge storage and an access transistor for connecting the storage capacitor with a bitline and sense amplifier for reads and writes. DRAM memory has the drawback of being volatile, but the nonvolatile alternative flash EEPROM memory suffers from slow writes. Ferroelectric memory as been proposed in which a capacitor with ferroelectric material between the capacitor plates stores an electric polarization and is nonvolatile. Basically, a ferroelectric memory cell can be read by first turning on the access transistor (essentially not affecting the bitline potential) and then pulsing the other ferroelectric capacitor plate with a voltage which causes the bitline potential to rise to one of two levels, depending upon whether or not the pulse reversed the polarization of the ferroelectric material. A DRAM-type sense amplifier can then latch the bitline potential provided a reference voltage is supplied which lies between the two levels. The reference voltage could be generated by a dummy ferroelectric capacitor cell.

Tanabe et al, A High Density 1T/2C Cell with Vcc/2 Reference Level for High Stable FeRAMs, 1997 IEEE IEDM Tech. Dig. 34.5.1 discloses a variation of the known ferroelectric memory cell array with two ferroelectric capacitors polarized in opposite directions in each cell.

SUMMARY OF THE INVENTION

The present invention provides a ferroelectric memory and method with a reference voltage circuit including a diode connected ferroelectric capacitor and with a sense amplifier including resistors for sensing transient switching currents from pulsed ferroelectric capacitors.

This has the advantages including simple circuitry.

BRIEF DESCRIPTION OF THE DRAWINGS

The drawings are heuristic for clarity.

DESCRIPTION OF THE PREFERRED EMBODIMENTS

System overview

The preferred embodiments provide a ferroelectric memory with a sense amplifier including resistors for detecting transient currents and a reference cell using a ferroelectric capacitor plus diode to prevent polarization switching for one-transistor/one-capacitor cell structures.

First preferred embodiment

Figure 1:
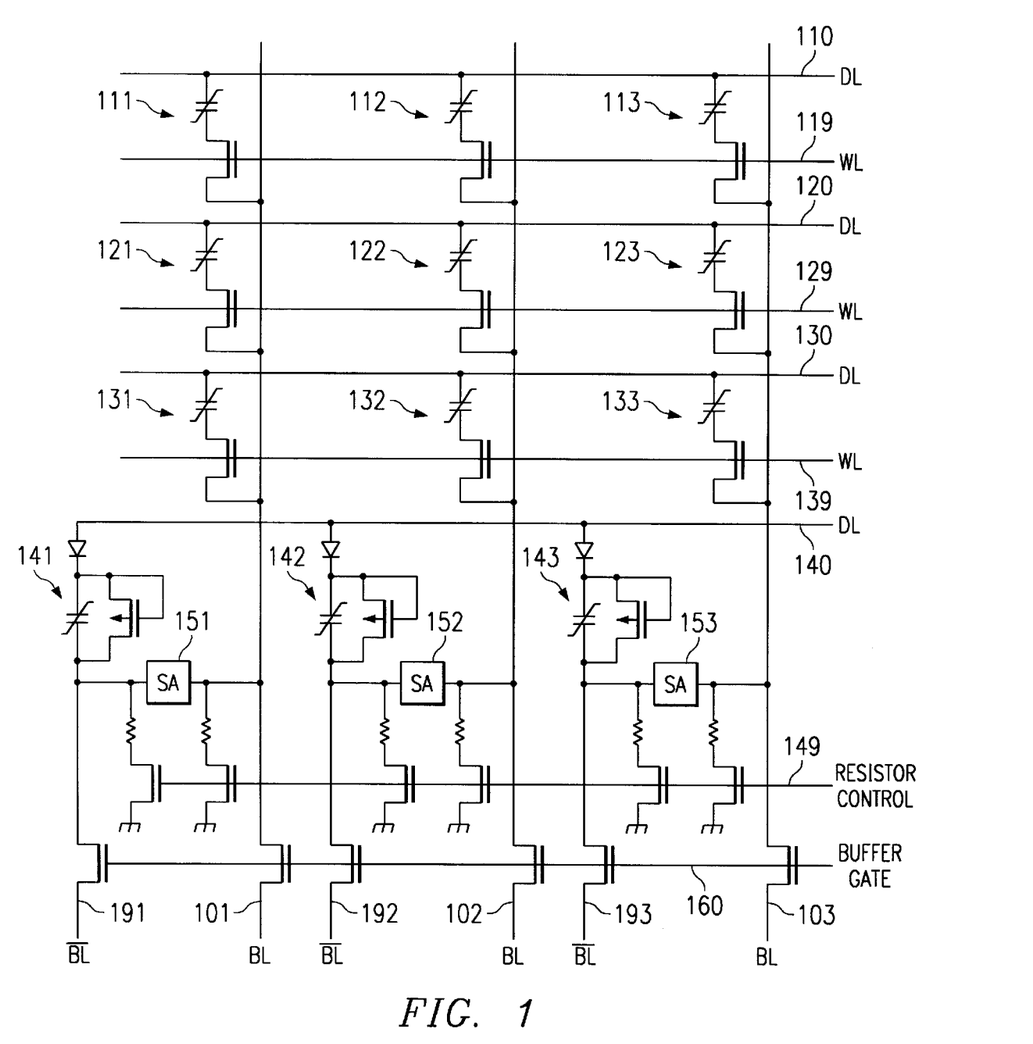
FIG. 1 illustrates a portion of a first preferred embodiment memory cell array and sense amplifiers.

FIG. 1 illustrates a portion of a first preferred embodiment array of ferroelectric memory cells 111–113, 121–123, and 131–133 together with reference cells 141–143 and sense amplifiers 151–153. In particular, each memory cell includes a ferroelectric capacitor connected between a driveline and an access transistor which connects to a bitline; the transistor gate connects to a wordline. All cells in a row have a common driveline and common wordline; see FIG. 1 with driveline 110 and wordline 119 for the first row, driveline 120 and wordline 129 for the second row, . . . , and reference cells 141–143 have driveline 140 but no wordline. Similarly, all cells in a column have a common bitline and the reference cell for the column connects (without an access transistor and wordline) to the complementary bitline; see FIG. 1 showing the first column with bitline 101 and complementary bitline 191, the second column with bitline 102 and complementary bitline 192, and so forth.

Figure 2:
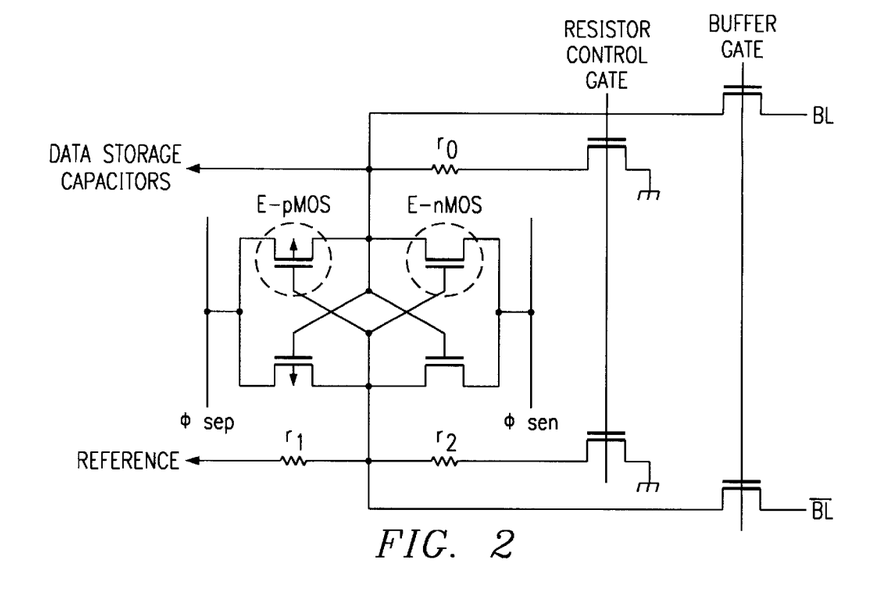
FIG. 2 shows a preferred embodiment sense amplifier plus resistors.

Sense amplifiers 151–153 each has a resistor at each of its two inputs (bitline and complementary bitline); FIG. 2 illustrates a sense amplifier as constituting a CMOS latch with the p-channel power supplied by the $\phi_{sep}$ line and the n-channel ground supplied by the $\phi_{sen}$ line. Resistor $r_0$ at the bitline sense amplifier input and resistor $r_2$ at the complementary bitline input may both have resistances of about 3 kohm, and resistor $r_1$ between the input and the reference cell may have a resistance of 1 kohm. (Note that FIG. 1 omits $r_1$.) These resistances presume a 2.5 volt switching applied to the ferroelectric capacitors with switched charge of 630 fC/um$^2$ and non-switched charge of 180 fC/um$^2$ and a capacitor area of 1 um$^2$ and a 1 nsec time constant in the sense amplifiers. The resistors convert the switching transient currents from the ferroelectric capacitors into voltages transients as described in the following. Resistor control line 149 control transistors connecting the resistors $r_0$ and $r_2$ to ground. Buffer line 160 controls transistors connecting the bitlines and complementary bitlines to input/output buffers (not shown in FIG. 1).

Figure 3A:
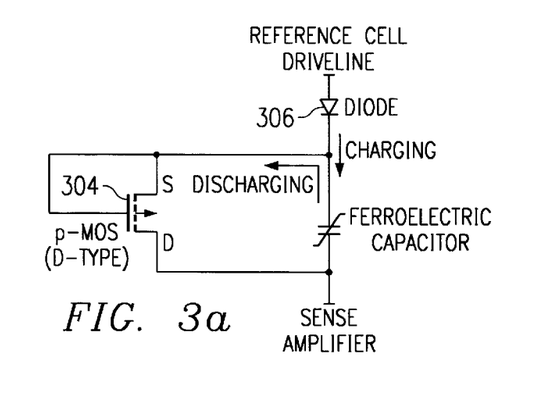
FIGS. 3a–3c show preferred embodiment reference cells and the hystersis loop.
Figure 3B:
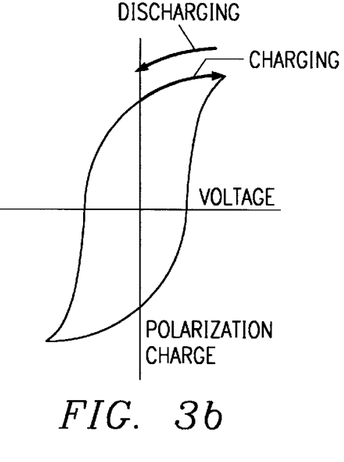
Figure 3C:
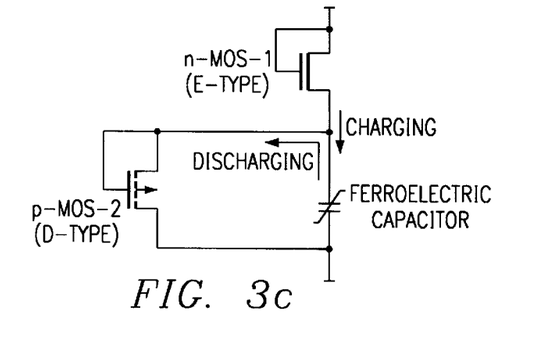

FIG. 3a shows a reference cell as including ferroelectric capacitor 302, depletion-mode transistor 304 acting as a large nonlinear resistance across capacitor 302, and diode 306 connecting one plate of capacitor 302 to the reference cell driveline; the other capacitor plate connects to a sense amplifier input through resistor $r_1$ as illustrated in FIG. 2. FIG. 3b illustrates the polarization-voltage behavior of ferroelectric capacitor 302. Diode 306 and transistor 304 maintain the ferroelectric polarization in one direction against external bias of either polarity; diode 306 limits the bias polarity. Discharging current flows through transistor 304.

The reference cell always outputs the constant non-switching charge of the ferroelectric capacitor. And thus taking the reference cell capacitor to be twice as large as an array cell capacitor, the constant non-switching charge will lie between the switched and non-switched charge from an array cell capacitor.

Figure 4:
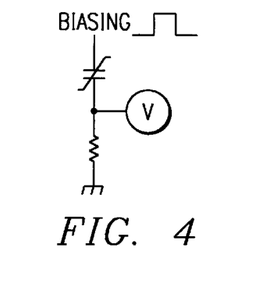
FIG. 4 is the equivalent circuit for the preferred embodiment ferroelectric capacitor and resistor feeding a sense amplifier.
Figure 5A:
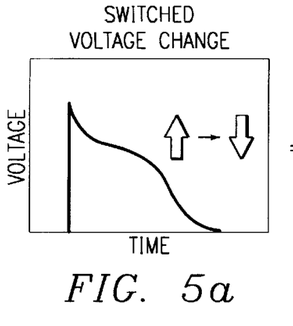
FIGS. 5a–5c show the sense amplifier input voltages.
Figure 5B:
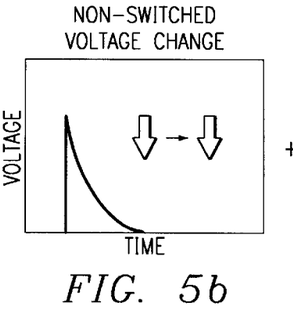
Figure 5C:
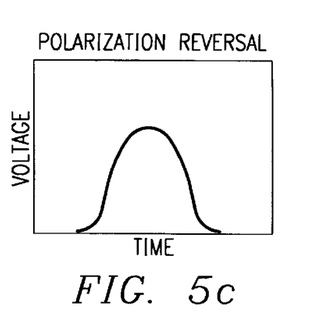

The preferred embodiment operates as follows. First, consider a ferroelectric capacitor with one plate connected to a resistor as in FIG. 4 and pulsed by a drive voltage on the other plate. The transient current induced in the resistor yields a voltage transient as illustrated in FIGS. 5a–5c. In particular, FIG. 5a shows the voltage when the drive pulse causes a polarization switch; FIG. 5b shows the voltage when the drive pulse leaves the polarization constant; and FIG. 5c shows the difference of the voltages of FIGS. 5a and 5b. That is, FIG. 5c shows the switched charge induced voltage alone.

Figure 6A:
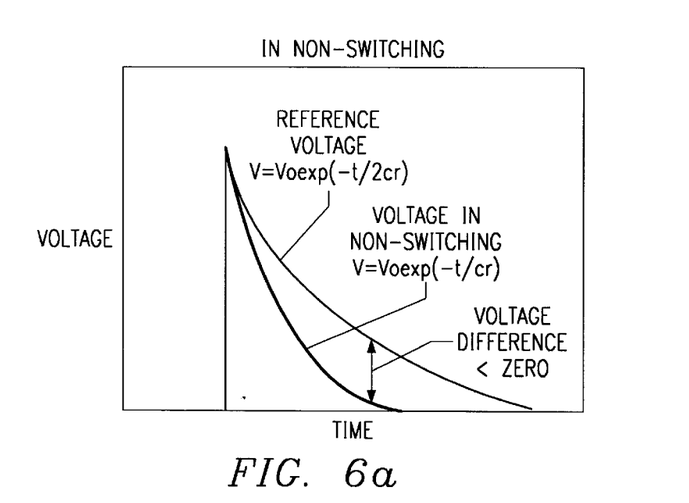
FIGS. 6a–6b illustrate the comparison of memory cell and reference cell voltages.
Figure 6B:
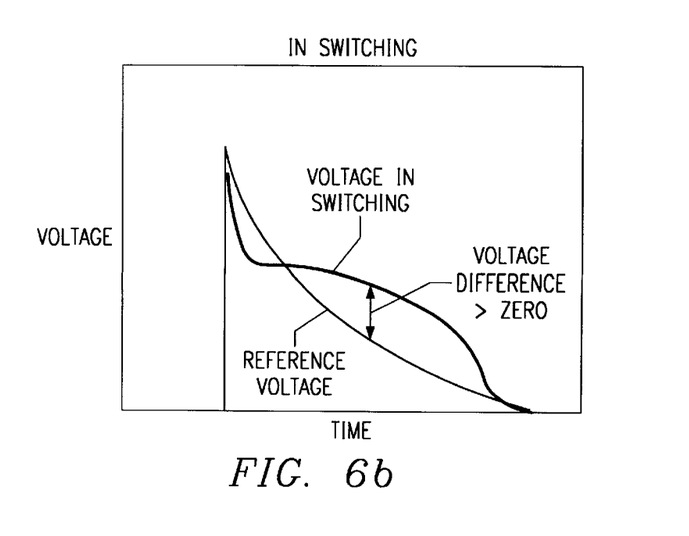

Of course, the induced current (and voltage) for the non-switched polarization case just has an exponential decay with RC time constant the product of the resistor resistance and the capacitance of the ferroelectric capacitor. In contrast, the switched polarization case has the additional effect of the polarization switching which provides a delayed current pulse as illustrated in FIG. 5c. Thus with the reference cell capacitor of twice the capacitance of an array cell capacitor, FIGS. 6a–6b show the sense amplifier input differences as functions of time for the cases of the array capacitor with polarization not switched and switched, respectively. That is, the non-switched array cell leads to a sense amplifier input voltage of $V(t)=V_0 e^{-t/rc}$, and the reference cell a voltage of $V(t)=V_0 e^{-t/2rc}$ where the 2 in the exponent from the 2c capacitance implies a much slower decay. The sense amplifier latches the voltage difference at the time indicated by the two-headed vertical arrows in FIGS. 6a–6b.

Figure 7A:
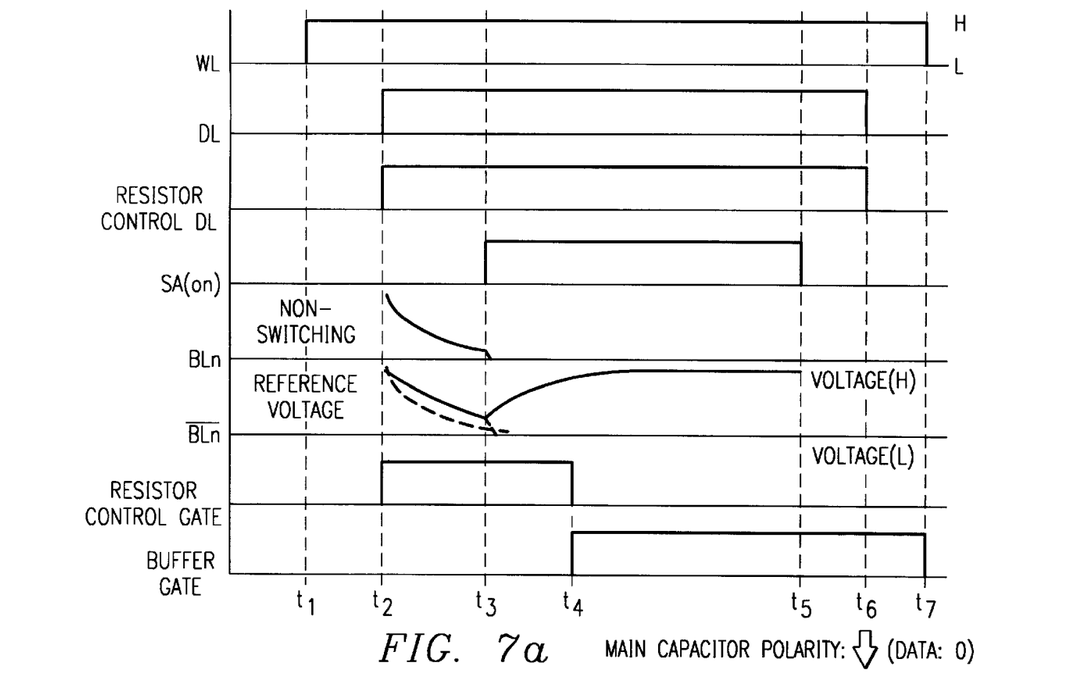
FIG. 7a–7b and 8a–8b are timing diagrams for data reads.
Figure 7B:
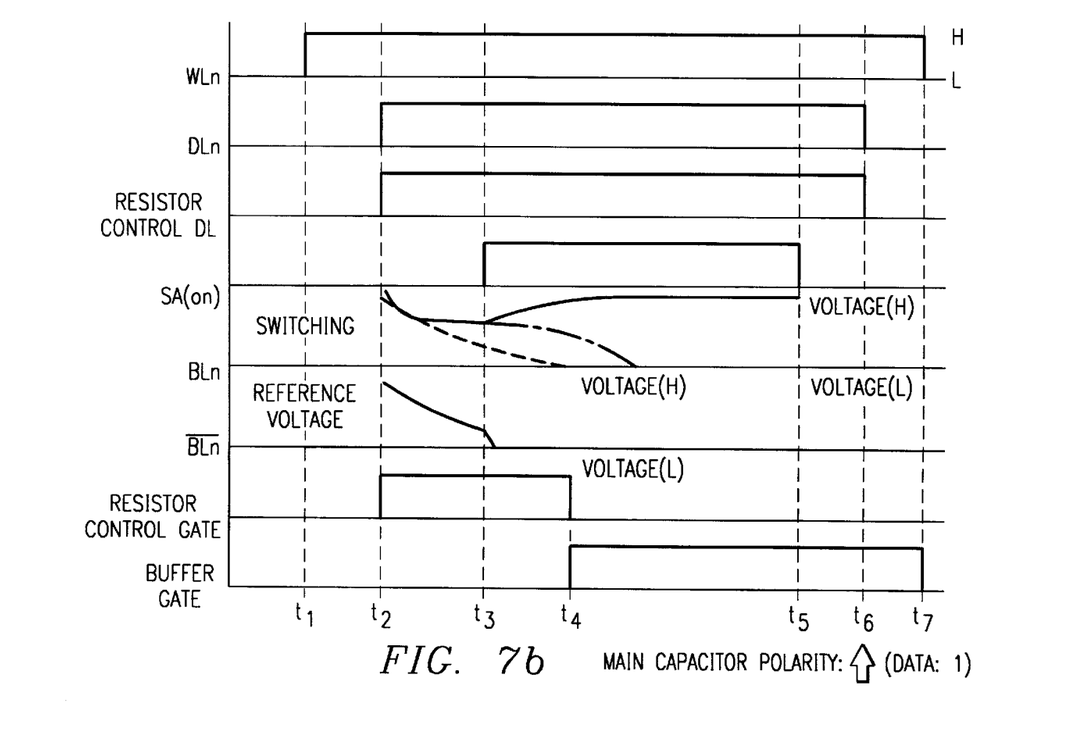

FIGS. 7a–7b are timing diagrams for the reads of an array capacitor for the polarization switched and non-switched cases, respectively. That is, reading a stored 0 and a stored 1, respectively. In particular, the first panel shows the wordline activated at time $t_1$ which turns on the access transistors in a row of the array to connect the capacitors to the bitlines; see FIG. 1. Note that the reference cells are already connected to the complementary bitlines. Next, at time $t_2$ the corresponding driveline goes high and jumps the bitline voltage; see panel 5. Also at time $t_2$ the reference cell driveline goes high (panel 3) to jump the complementary bitline voltage (panel 6) plus the gateline goes high (panel 7) to connect the resistors to ground. The voltage on the bitline depends upon the polarization of the array capacitor (compare panel 5 in FIGS. 7a and 7b); whereas the voltage on the complementary bitlines are always the same (panel 6). Then at time $t_3$ the sense amplifiers are activated (panel 4) through the p-channel power supplied by the $\phi_{sep}$ line going high and the n-channel ground supplied by the $\phi_{sen}$ line going low. This latches the voltage difference between the bitlines and the complementary bitlines as indicated by panels 5 and 6. Ideally, time $t_3$ corresponds to the time indicated by the vertical arrows in FIGS. 6a–6b. The latching by the sense amplifier also rewrites the latched data bits back to the array ferroelectric capacitors; thus the destructive read is reversed.

At time $t_4$ the resistor control line goes low to disconnect the resistors from ground; this avoids power drain through the resistor which connects to the bitline or complementary bitline which is pulled high by the sense amplifier. Also at time $t_4$ the buffer line goes high to connect the bitlines and complementary bitlines to output buffers (not shown in FIG. 1).

At time $t_5$ the sense amplifier turns off and the access transistors turn off.

Figure 8A:
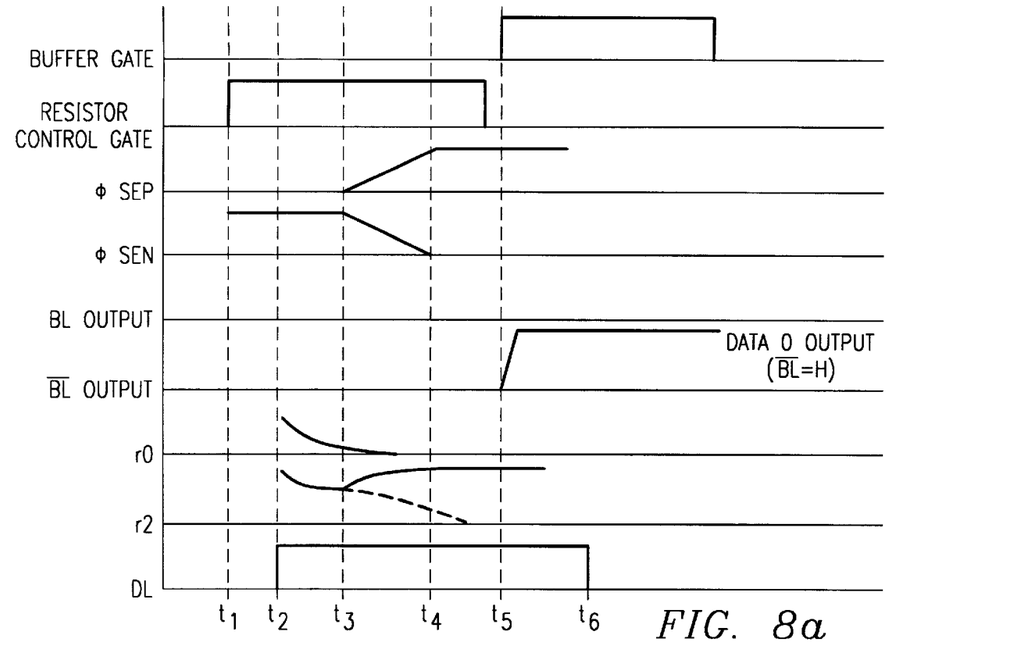
Figure 8B:
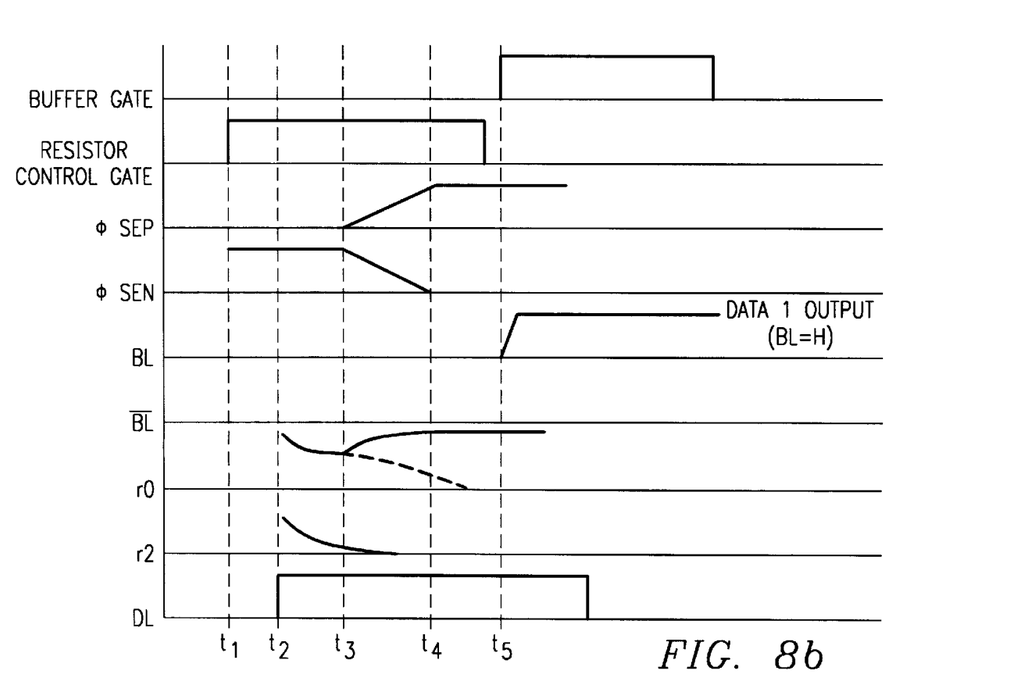

FIGS. 8a–8b show alternative timings for the read operation. In particular, the resistors $r_0$ and $r_2$ are connected to ground by the resistor control line (panel 2) going high at time $t_1$ prior to the array capacitor driveline (panel 9) pulsing at time $t_2$. Again, activate the sense amplifiers by the $\phi_{sep}$ line (panel 3) going high and the n-channel ground supplied by the $\phi_{sen}$ line (panel 4) going low, although this activation is a ramp from time $t_3$ to time $t_4$. Activating the sense amplifiers again latches the voltage difference between the bitlines and the complementary bitlines as indicated by panels 7 and 8. Ideally, the time indicated by the vertical arrows in FIGS. 6a–6b corresponds to a time in the interval from $t_3$ to $t_4$.

At time $t_5$ the resistor control line has just disconnected the resistors from ground and the buffer line (panel 1) goes high to connect the bitlines and complementary bitlines to the output buffers (panels 5 and 6).

Figure 9A:
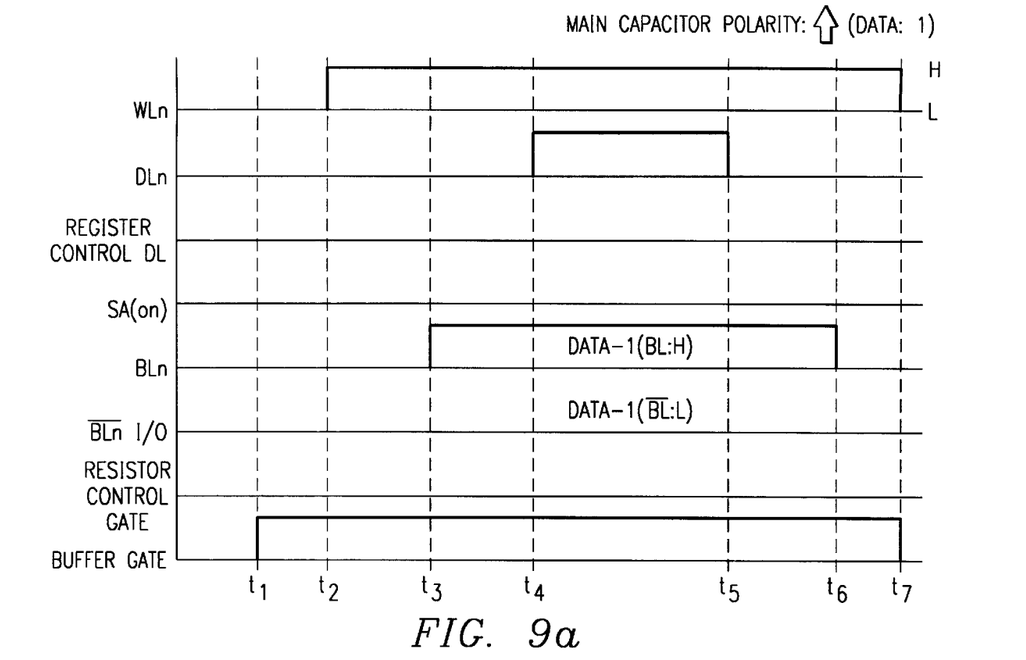
FIGS. 9a–9b are timing diagrams for data writes.
Figure 9B:
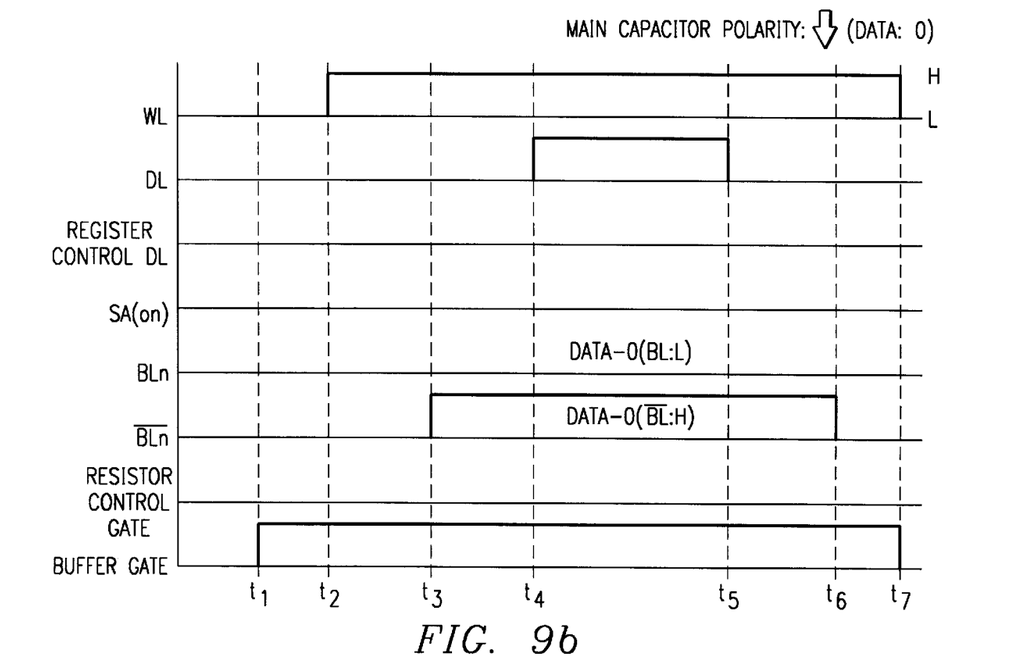

FIGS. 9a–9b are timing diagrams for the writing of 0 and 1 data to an array capacitor, respectively. In particular, at time $t_1$ the buffer line goes high to connect the input buffers (which are outputting lows) to the bitlines and complementary bitlines and to the inputs of the sense amplifiers (which are turned on). Next, at time $t_2$ the wordline for the row of array capacitors to be written to goes high (FIGS. 9a–9b panel 1) to turn on the access transistors and connect the capacitors to the bitlines. At time $t_3$ the input buffers put the bits to be written on the bitlines and complementary bitlines: to write a 1 the bitline is high and the complementary biltine is low (FIG. 9a panels 5–6), and to write a 0 the bitline is low and the complementary bitline is high (FIG. 9b panels 5–6). At time $t_4$ the driveline for the row of array capacitors goes high (panel 2), and then at time $t_5$ it returns low; note that the driveline for the reference cells remains low (panel 3). This time interval with the driveline high forces the polarizations of the array capacitors to correspond to the bitlines highs and lows; this is the write. At time $t_6$ the input buffers go low, and at time $t_7$ the wordline and the buffer line go low to complete the cycle.

Stray Capacitance Analysis

Figure 10A:
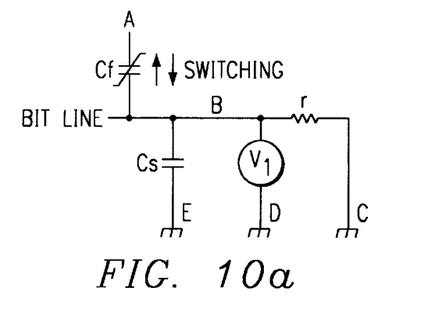
FIGS. 10a–10d show models and voltage curves for inclusion of parasitic capacitance.
Figure 10B:
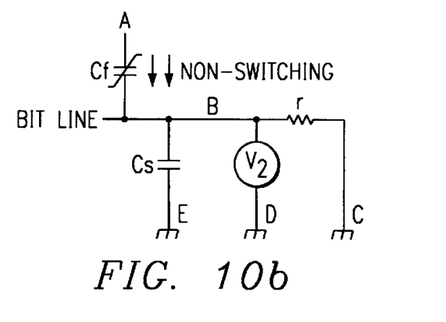

The bitlines may present a fairly large stray capacitance in parallel to the ferroelectric capacitors when accessed, and during a read this stray capacitance affects the voltages induced on the bitlines. In particular, consider FIGS. 10a–10b which model a stray capacitance $C_s$ on the bitline together with the sense amplifier resistor of resistance r and sense amplifier input voltage $V_1$ (for ferroelectric material polarization switching during read as in FIG. 10a) or $V_2$ (for no polarization switching during read as in FIG. 10b) plus the ferroelectric capacitor with paraelectric capacitance $C_f$. Data from an experimental ferroelectric capacitor yielded a switched charge (at 2.5 volts) equal to 550 fC/um$^2$ and a nonswitched charge equal to 100 fC/um$^2$ (so the paraelectric capacitance of the ferroelectric capacitor is about 40 fC/um$^2$). A bitline stray capacitance of 250 fF may be presumed to perform numerical computations. For the non-switching read, when the drive line voltage jumps to $V_0$ the voltage across the resistor $V_2$ initially jumps to $V_0 C_f/(C_f+C_s)$ rather than $V_0$ as would be the case with zero stray capacitance. This voltage then decays through the resistor as $V_2 = [V_0 C_f/(C_f+C_s)] e^{-t/r(C_f+C_s)}$.

Figure 10C:
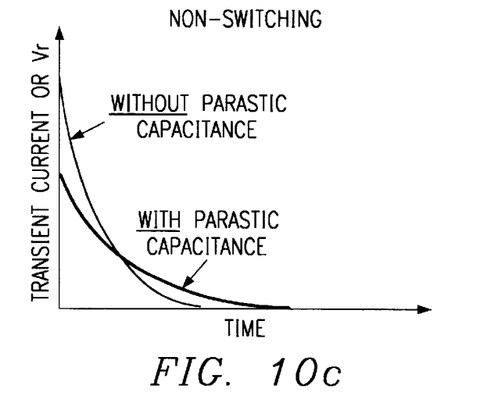
Figure 10D:
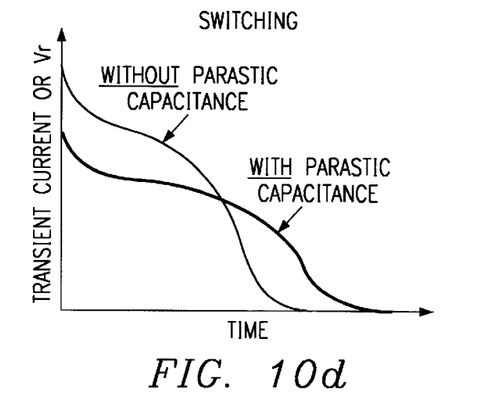

FIG. 10c illustrates this lowering of the initial voltage and increased RC time constant as compared to the case of $C_s=0$. The switching case is analogous and illustrated in FIG. 10d.

Figure 11:
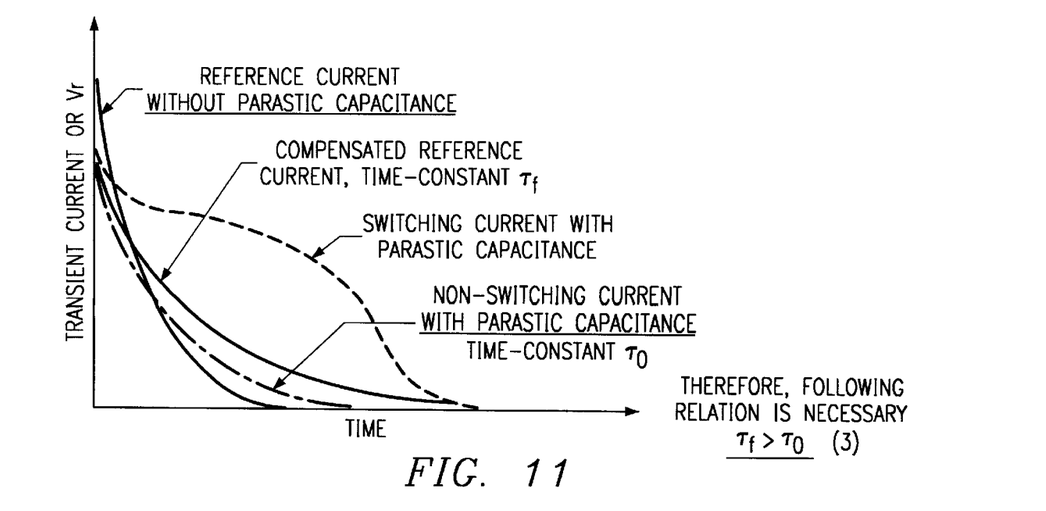
FIG. 11 compares reference sources.
Figure 12:
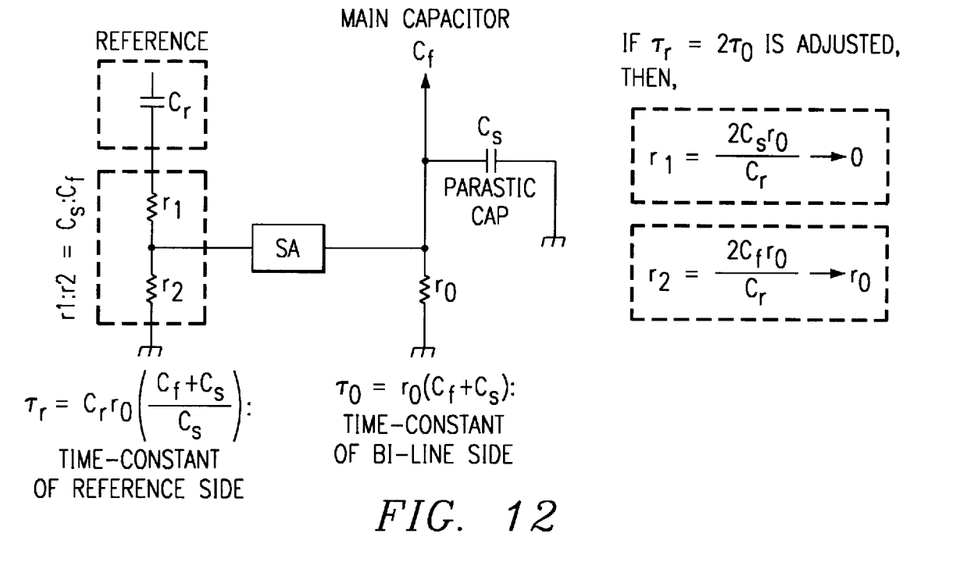
FIG. 12 shows a model for resistance computations.

To compensate for this decrease in initial voltage and increased time constant, the reference current source (see FIG. 2) has a voltage divider (resistances $r_1$ and $r_2$) with the resistances set so the RC time constant of the reference is twice the RC time constant of the nonswitching read with parasitic capacitance; see FIG. 11. More explicitly, FIG. 12 shows a model of the storage ferroelectric capacitor plus bitline stray capacitance, reference capacitor plus resistors, and sense amplifier.

First, with the ratio of the resistances $r_1$ to $r_2$ the same as the ratio of the capacitances $C_s$ to $C_f$, the initial voltage at the reference side input to the sense amplifier will equal the initial voltage at the bitline side input. That is, the resistors are just a voltage divider of the drive line voltage pulse of $V_0$.

Next, the bitline side input voltage of a nonswitching read has an RC time constant of $r_0(C_f+C_s)$, and the reference side input voltage should have an RC time constant of $2r_0(C_f+C_s)$ as noted previously in connection with the discussion of FIGS. 6a–6b. Thus simply take the reference capacitance $C_r=2C_f$ and consequently $r_1=r_0C_s/C_f$ and $r_2=r_0$.

Figure 13:
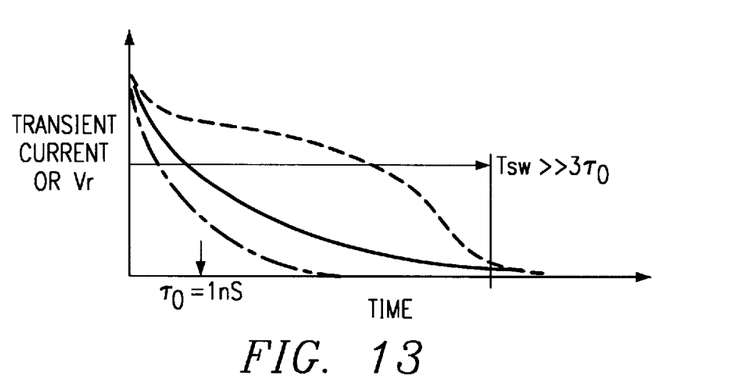
FIG. 13 illustrates the sense amplifier input voltage curves for a read.

The resistances can be evaluated as follows. Presume the parasitic capacitance $C_s=250$ fF, the switched charge at 2.5 volts from a storage ferroelectric capacitor is 630 fC/um$^2$, the nonswitched charge at 2.5 volts is 180 fC/um$^2$ (so the paraelectric capacitance is 72 fF/um$^2$), the storage ferroelectric capacitors have an area of 1.0 ur$^2$, and the sense amplifier operates in few nanoseconds. Thus take the RC time constant $r_0(C_f+C_s)=1.0$ ns. Inserting the capacitance values yields $r_0=3.0$ kohm. Hence, $r_1=1.04$ kohm and $r_2=3.0$ kohm. FIG. 13 shows the timing of a read with the switching time more than three times the RC time constant $\tau_0$.

Modifications

The preferred embodiments can be modified in various ways while retaining the feature of a resistor coupled sense amplifier inputs and a diode limited reference cell.

For example, the resistors could be MOS transistors; the reference capacitor could be a paraelectric capacitor rather than a ferroelectric capacitor because the ferroelectric switching is not used.

What is claimed is:

1. A memory, comprising:
   (d) a plurality of ferroelectric capacitor cells;
   (e) a reference capacitor cell; and
   (f) a sense amplifier with a first input coupled between a first resistor and said ferroelectric capacitor cells and with a second input coupled to a second resistor and to said reference capacitor cell.

2. The memory of claim 1, wherein:
   (a) said reference capacitor cell includes a reference ferroelectric capacitor plus a diode between said reference ferroelectric capacitor and a drive line.

3. The memory of claim 1, wherein:
   (a) said reference capacitor cell has about twice the capacitance of one of said ferroelectric capacitor cells.

4. The memory of claim 3, wherein:
   (a) the resistance of said first resistor about equals the resistance of said second resistor.

5. The memory of claim 1, wherein:
   (a) the ratio of the resistance of said second resistor to the resistance of said first resistor about equals the ratio of twice the capacitance of said ferroelectric capacitor to the capacitance of said reference capacitor.

6. The memory of claim 1, wherein:
   (a) a third resistor is connected between said second input of said sense amplifier and said reference capacitor.

7. The memory of claim 6, wherein:
   (a) the ratio of the resistance of said third resistor to the resistance of said first resistor about equals the ratio of twice the stray capacitance of a bitline coupling said ferroelectric capacitor to the capacitance of said reference capacitor.

\* \* \* \* \*